(12) United States Patent
Ferrer Medina et al.

(10) Patent No.: US 11,974,414 B2
(45) Date of Patent: Apr. 30, 2024

(54) CONFORMING HEAT TRANSPORT DEVICE FOR DUAL INLINE MEMORY MODULE COOLING APPLICATIONS

(71) Applicant: HEWLETT PACKARD ENTERPRISE DEVELOPMENT LP, Houston, TX (US)

(72) Inventors: Ernesto Ferrer Medina, Aguadilla, PR (US); Harvey J. Lunsman, Chippewa Falls, WI (US); Tahir Cader, Liberty Lake, WA (US); John Franz, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 288 days.

(21) Appl. No.: 17/604,827

(22) PCT Filed: Aug. 23, 2019

(86) PCT No.: PCT/US2019/047995
§ 371 (c)(1),
(2) Date: Oct. 19, 2021

(87) PCT Pub. No.: WO2021/040679
PCT Pub. Date: Mar. 4, 2021

(65) Prior Publication Data
US 2022/0053668 A1    Feb. 17, 2022

(51) Int. Cl.
*H05K 7/20*    (2006.01)
*G06F 1/20*    (2006.01)
*H05K 1/02*    (2006.01)

(52) U.S. Cl.
CPC .......... *H05K 7/20509* (2013.01); *G06F 1/20* (2013.01); *H05K 1/0203* (2013.01)

(58) Field of Classification Search
CPC . G06F 1/20; G06F 2200/201; H05K 7/20509; H05K 7/20809; H05K 7/20772; H05K 1/0203; H05K 7/2039
See application file for complete search history.

(56) References Cited

U.S. PATENT DOCUMENTS 7,619,893 B1 * 11/2009 Yu .................. H01L 23/4093
                                                        257/713
8,587,943 B2    11/2013   Barina et al.
(Continued)

OTHER PUBLICATIONS

Gullbrand, J. et al., "Liquid Cooling of Compute System," Journal of Electronic Packaging, Mar. 1, 2019, vol. 141, Issue 1, Retrieved on Jul. 15, 2019, http://www.electronicpackaging.asmedigitalcollection.asme.org/article.aspx?articleid=2724839.
(Continued)

*Primary Examiner* — Adam B Dravininkas
(74) *Attorney, Agent, or Firm* — Hewlett Packard Enterprise Patent Department

(57) ABSTRACT

A circuit board cooling apparatus is disclosed having a heat spreader device to be thermally coupled with a surface of the circuit board to be cooled. Also, a conforming heat transfer device is disclosed that is thermally and physically coupled with the heat spreader device to conform to a surface contour of the heat spreader device on a first side of the heat transfer device. The cooling apparatus also includes a heat transport device physically attached and thermally coupled with a second side of the heat transfer device.

19 Claims, 6 Drawing Sheets

(56) References Cited

U.S. PATENT DOCUMENTS

| | | | |
|---|---|---|---|
| 8,638,559 | B2 | 1/2014 | Barina et al. |
| 8,659,897 | B2 | 2/2014 | Meijer et al. |
| 9,786,578 | B2 | 10/2017 | Cox et al. |
| 10,021,814 | B2 | 7/2018 | Aoki et al. |
| 10,499,488 | B1* | 12/2019 | Tsai ................ H05K 1/144 |
| 2009/0277616 | A1* | 11/2009 | Cipolla ............ H01L 23/473 |
| | | | 165/104.33 |
| 2011/0286175 | A1 | 11/2011 | Iyengar et al. |
| 2012/0314363 | A1 | 12/2012 | Kalms et al. |
| 2013/0194745 | A1* | 8/2013 | Meijer ................ G06F 1/20 |
| | | | 361/679.47 |
| 2018/0063998 | A1 | 3/2018 | Aoki et al. |
| 2019/0029146 | A1 | 1/2019 | Cuda et al. |

OTHER PUBLICATIONS

Search Report and Written Opinion received for PCT Application No. PCT/US2019/047995, dated May 22, 2020, 11 pages.

* cited by examiner

CONFORMING HEAT TRANSPORT DEVICE FOR DUAL INLINE MEMORY MODULE COOLING APPLICATIONS

BACKGROUND

Computer systems include electronic components and circuits, such as central processing units (CPU) and memory modules, which consume electrical power to operate. All the electrical power consumed by these circuits eventually are given off as heat. In high density systems having many circuits in a relatively small space, the heat density increases. Cooling a computer system may increase its performance and/or extend its useful life.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
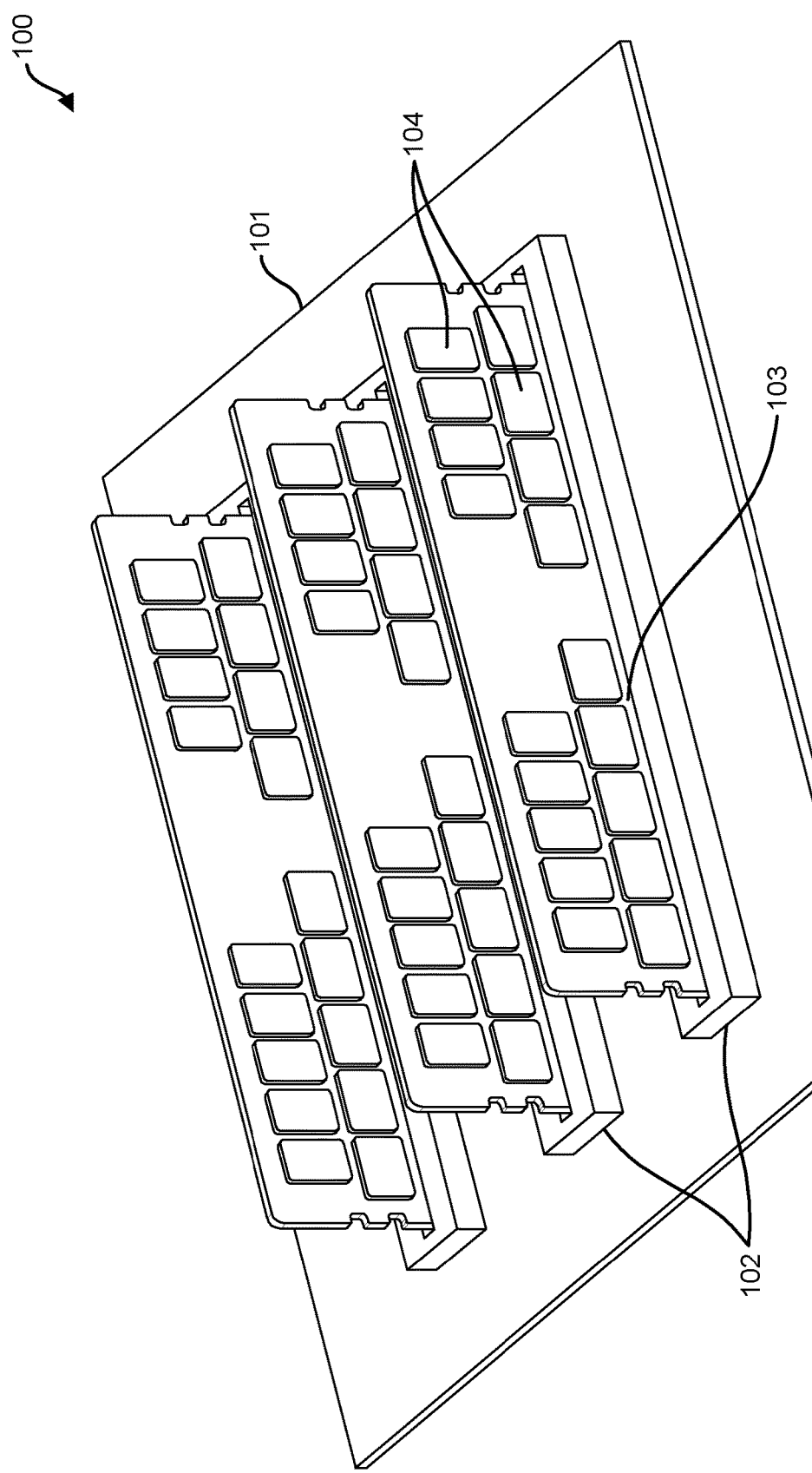
FIG. 1 is a computer memory system having a memory board supporting several dual inline memory modules (DIMM) deployed thereon, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the terms "about" and "approximately" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of the associated listed items. Moreover, examples herein are intended to be illustrative only and are presented for discussion purposes and not by way of limitation.

To cool electronic circuits, such as DIMMs, in a computer system different approaches may be used. Generally, there are three modes of heat transfer: conduction, convection, and radiation. These three modes, which may occur simultaneously, may be used to heat or cool a physical body, depending on whether heat is added to or removed from the body, respectively. Conduction is a mode of heat transfer that occurs by physical contact between two bodies at different temperatures. In convection, direct physical contact is not necessary but a working fluid, such as air or water, may be used to carry thermal energy to or from a body to be heated or cooled, respectively. Radiation occurs by emanation of electromagnetic waves carrying energy and does not depend on physical contact or a working fluid. Computer systems are often cooled using conduction, convection, or both, as practical methods with sufficient heat removal capacity.

Convection is sometimes insufficient for cooling a computer system if the heat density, defined as generation and/or flow of thermal energy per unit area per unit time, is high enough. When heat density passes a particular value or threshold, depending on the physical arrangement and spaces involved, convection by forced air may not remove sufficient heat to effectively cool the system and its components. Additionally, some computer systems, such as embedded computers, may be sealed with no air inlet or outlet to allow convection. In such situations, conduction may be a more effective choice for cooling the circuits. Furthermore, conduction may be more specifically targeted than blown air to hot spots within a computer system via physical routing of heat conducting material such as rods and metal surfaces, thus, cooling the areas most in need of heat removal.

A cooling system and method to cool a computer system is disclosed that in various examples includes a rigid heat spreader device thermally coupled with a heat-generating circuit board, to be cooled, such as a DIMM, a heat-transfer device coupled with the heat spreader via conforming (e.g., spring-loaded) tabs or sections to conform to the surface contours of the heat spreader on one side of the heat-transfer device, and coupled with a heat transport device on the other side. The heat spreader device may be made of a thin heat-conductive layer, such as a U-shaped metal plate that covers both surfaces of the circuit board to increase heat distribution and transfer. A pliant heat-conductive material, such as paste or grease, may be deployed between the heat spreader device and the circuit board to create a broader and more complete thermal path for conduction. The heat transfer device may be made of thin metal sheets or other rigid conductive material. The heat transfer device may be integrated with or closely attached to the heat transport device for high thermal conduction. The heat transport device may be a heat pipe, liquid cooling device, or other similar heat transfer implements. The heat transport device may be coupled with an active or passive refrigeration system, radiator, or convection system to remove heat from the computer system's environment.

A circuit board cooling apparatus is disclosed herein having a rigid heat spreader device to be thermally coupled with a surface of the circuit board to be cooled. Also, a conforming heat transfer device is disclosed that is thermally and physically coupled with the heat spreader to conform to a surface contour of the heat spreader on a first side of the heat transfer component. The cooling apparatus also includes a heat transport device physically attached and thermally coupled with a second side of the heat transfer device.

A computer memory system cooling apparatus is disclosed herein with a first base memory board to support and connect with a multiple memory modules and a second base memory board also including multiple memory modules, facing the first memory board. In this configuration, the memory modules on the first memory board and the second memory board may be interdigitated (every other memory module being from a different memory board), and each of the plurality of memory modules on both the first memory board and the second memory board includes two cooling apparatuses, each cooling apparatus having a rigid heat spreader device to be thermally coupled with a surface of the memory module, a single-sided conforming heat transfer device thermally and physically coupled with the heat spreader to conform to a surface contour of the heat spreader on a first side of the heat transfer component, and a heat transport device physically attached and thermally coupled with a second side of the heat transfer device.

Another computer memory system cooling apparatus is disclosed having a first base memory board including a plurality of memory modules and a second base memory board including multiple memory modules, facing the first memory board. The multiple memory modules on the first memory board and the second memory board may be interdigitated to increase memory density. Each pair of memory modules on both the first memory board and the second memory board share two cooling apparatuses. Each cooling apparatus may have a rigid heat spreader device to be thermally coupled with a surface of the memory module, a double-sided conforming heat transfer device thermally and physically coupled with the heat spreader to conform to a surface contour of the heat spreader on a first side of the heat transfer component, and a heat transport device physically attached and thermally coupled with a second side of the heat transfer device.

Now with reference to the figures, FIG. 1 is a computer memory system 100 having a memory board 101 supporting several dual inline memory modules (DIMM) 103 deployed thereon, according to one or more examples of the disclosure. In an example implementation, computer memory system 100 includes one or more DIMM 103 plugged into supporting slots 102, each DIMM having one or more memory chips 104 on one or both sides of the DIMMs 103.

The computer memory system 100 may be a motherboard in a computer system that includes the CPU, input/output (I/O) modules, and other circuit components including slots for adding various devices such as printers, universal serial bus (USB) interface, high definition multimedia interface (HDMI), and memory modules such as random access memory (RAM), read only memory (ROM), and DIMM among other components. These types of components as well as other features that the computer memory system 100 may have in various examples have not been shown for the sake of clarity and so as not to obscure that which is claimed below. In other example implementations, the computer memory system 100 may be a dedicated board used to accommodate multiple DIMMs for creating a high-density memory subsystem in a relatively small physical space.

DIMMs are double single inline memory modules (SIMMs) that may include RAM, dynamic RAM (DRAM), synchronous DRAM (SDRAM), static RAM (SRAM), or other types of memory. The memory may be 8-bit, 16-bit, 32-bit, 64-bit, and the like, data path width depending on the memory and system bus design and may include additional bits for error correction, such as parity bits or error correcting code (ECC) bits. The DIMM may have 72, 168, 288 or other number of pins on its edge to allow high data throughput from the DIMM to the memory board 101 and on to CPU and other data paths. The DIMM memory technology is advancing at a rapid pace and recent additions include double data rate fourth generation (DDR4) with increased clock speeds. With DDR5, data transfer rates are currently exceeding about 25 gigabytes (GB) per second. Generally, the faster and denser the circuits are, the more heat is generated and the more cooling capacity is needed. The DIMM boards may also vary in size and form factor including small outline DIMM (SO-DIMM) used mainly in portable devices such as laptop computers. Another form factor that is available is very low profile (VLP) form factor.

The memory chips 104 also continue to increase in memory density with 8, 16 and 64 GB being currently available.

Figure 2A:
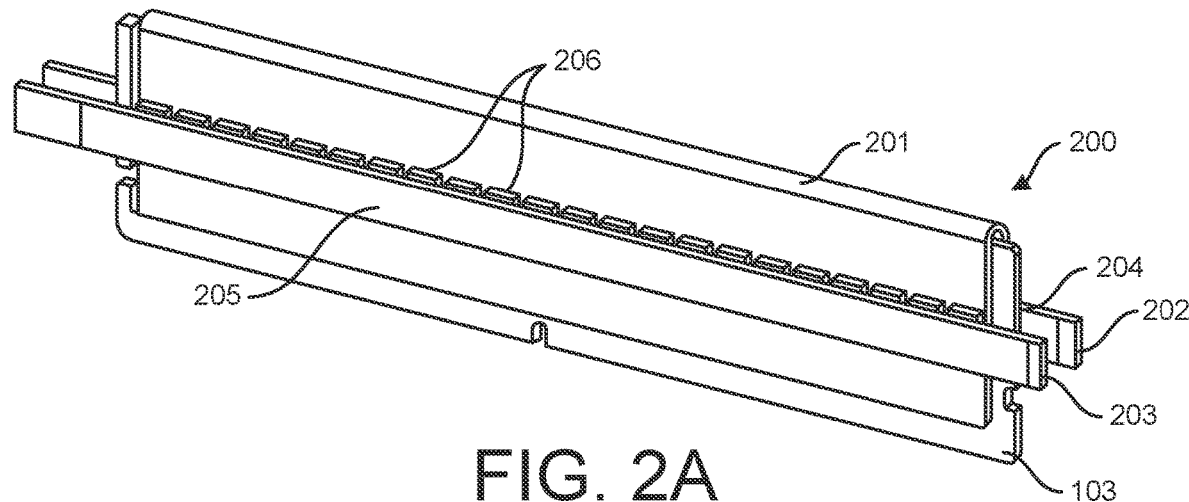
FIG. 2A is a DIMM assembly integrated with one type of cooling apparatus, according to one or more examples of the disclosure.

FIG. 2A depicts a DIMM assembly 200 integrated with one type of cooling apparatus, according to one or more examples of the disclosure. In an example implementation, the DIMM assembly 200 may include a DIMM 103, a U-shaped, or bight structure, heat spreader device 201, heat transport devices 202 and 203 physically attached to heat transfer devices 204 and 205, the heat transfer devices 204 and 205 having elastic tabs or fingers 206.

The DIMM 103 may have any form factor. For dense modern computers and servers, the DIMMs are packed more densely than before and run at higher clock speeds. As such, cooling may be targeted to the hot spots, namely the memory chips 104 (see FIG. 1), to increase effective cooling for a given physical configuration. This may be accomplished by using the rigid U-shaped heat spreader device 201, which straddles the DIMM 103. A thermal interface or pliant gap-filler material 208, such as thermal conductive grease, thermal conductive paste, a thin metal layer, a 3-D thermal conductive plastic fabric, gap pad, and the like may be used between the memory chips 104 and heat spreader device 201 to create a complete thermal path without bubbles, gaps, or non-contact areas, to transfer and distribute heat from the memory chips 104 to the heat spreader device 201. Those skilled in the art, having the benefit of this disclosure, will appreciate that the heat spreader device 201 may have a cross section that is other than U-shaped. It may be square, triangular, or have any other shape that connects the two surfaces of the heat spreader.

Generally, the heat spreader device 201 may be constructed from rigid material that holds its shape when applied to a DIMM. Rigidity of the heat spreader device allows the elastic tabs 206 on the heat transfer device 205 to engage the rigid surface of the heat spreader device 201 and make better thermal contact than a non-rigid surface which yields under pressure and may not make as good a thermal contact.

The heat transfer devices 204 and 205 may be physically attached to the heat transport devices 202 and 203 for better thermal contact and heat transfer. The physical attachment between the heat transfer devices 204 and 205 and the heat transport devices 202 and 203 may be implemented by tightly wrapping the heat transfer devices 204 and 205 around the heat transport devices 202 and 203, respectively, spot-welding or soldering, using heat-conductive adhesives, or any other method of attachment suitable for effective conductive heat transfer.

The heat transfer devices 204 and 205 may be made of thin and compliant material like a malleable sheet metal, such as steel or copper, heat conductive plastic sheet that is also elastic, heat conductive laminate materials that combine conductivity with elasticity, and the like. The heat transfer devices 204 and 205 may include elastic tabs or fingers 206 that conform to the two surfaces of the heat spreader device 201 by elastic force to increase or effectively maximize thermal contact area for conductive heat transfer.

With continued reference to FIG. 2A, in some example implementations, the heat transfer devices 204 and 205 may include multiple elastic tabs 206 along the contact surface area engaging the heat spreader device 201. In this configuration, the elastic tabs 206 conform to the contact surface of the heat spreader device 201 independently, each being compressed against the contact surface as far as it can. This way, gaps, contours, or surface irregularities at a particular locality along the DIMM 103 are conformed to locally by the elastic tab 206 at that locality. The elastic tabs 206 may have a square shape, a round shape, a triangular shape or any other regular or irregular shape that can make good contact for heat transfer purposes with the heat spreader device 201 surface. In other implementations, the heat transfer devices 204 and 205 may have no separate elastic tabs but one continuous elastic edge. This way, the manufacturing of the heat transfer devices 204 and 205 may be simpler because individual tabs are not formed or made. The installation of the heat transfer devices 204 and 205 on the heat spreader device 201 may also be simpler.

The heat transport devices 202 and 203 take away the heat extracted by the heat spreader device 201 and the heat transfer devices 204 and 205 from the heat sources memory chips 104 and remove the heat from the computing environment, such as the computer system enclosure or case and the computing space, such as a server room. The heat transport devices 202 and 203 may be any cooling apparatus used to extract the heat generated by electronic components and move it away from the system containing those components. Examples of such devices include heat pipes, solid conductors, direct liquid cooling conduits, and the like, although this list is neither exclusive nor exhaustive. Even though the present specification discusses heat transfer using heat pipes, it will be appreciated that the discussion applies to other heat transport devices, some of which are named above.

Heat pipes operate internally based on passive convection. On the hot end (where heat is generated or transferred to the heat pipe), an internal working fluid is evaporated and removes heat, the middle end is insulated (adiabatic section), which causes the expanding fluid to move to the other cold end of the heat pipe that is located in a lower temperature environment. The working fluid condenses at the cold end and returns to the hot end by capillary action of a wick along the internal walls of the heat pipe. The structure of the DIMM assembly 200 is further described below with respect to FIG. 23.

Figure 2B:
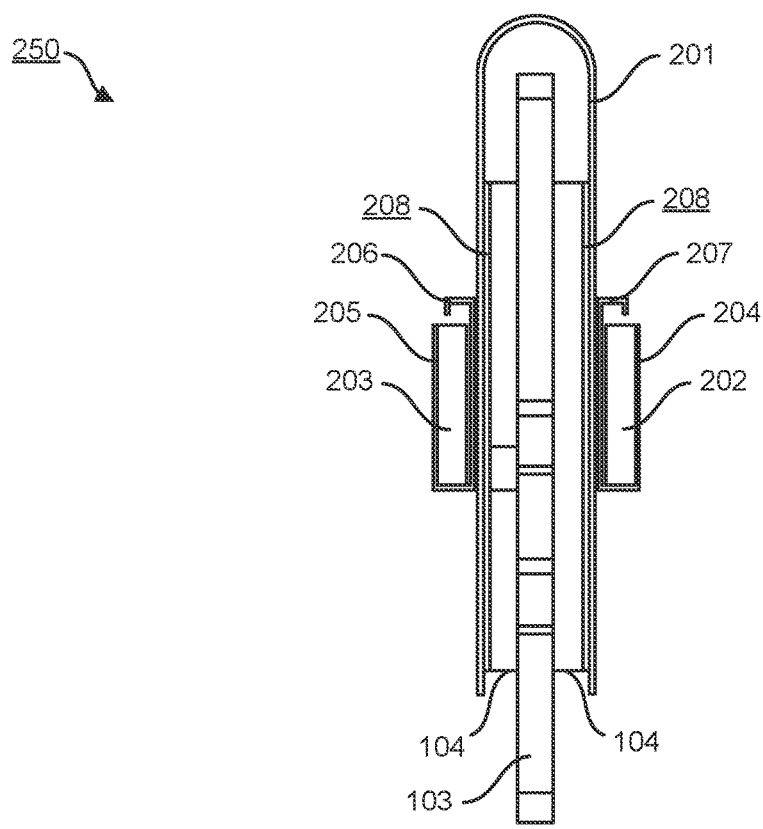
FIG. 2B is a cross sectional A-A view of the DIMM assembly of FIG. 2A, according to one or more examples of the disclosure.

FIG. 2B is a cross sectional view 250 of the DIMM assembly of FIG. 2A, according to one or more examples of the disclosure. The cross sectional view 250 includes DIMM 103, memory chips 104, U-Shaped heat spreader device 201, heat transport devices 202 and 203, heat transfer devices 204 and 205 having tabs or fingers 207 and 206, respectively, and pliant gap-filler material 208.

The memory chips 104 on both sides of the DIMM 103 are coupled to the interior surfaces of the heat spreader device 201 (the surfaces enclosed by the heat spreader device sides) via the pliant gap-filler material 208 to create a high capacity and effective conductive path between the memory chips 104 and the inner surfaces of the heat spreader device 201. The heat spreader device 201 allows the heat extracted from the memory chips 104 to be spread over the wider surface of the heat spreader device 201, reducing heat density.

The heat spreader device 201 is coupled, on its exterior surfaces, with the elastic or spring-loaded tabs or fingers 207 and 206 of the heat transfer devices 204 and 205, respectively. As noted above with respect to FIG. 2A, the elastic tabs 207 and 206 exert a physical force on the exterior surfaces of the heat spreader device 201 and conform to the shape of the exterior surfaces of the heat spreader device 201, to form a higher capacity and more effective thermal conductive connection compared with not having an elastic member exert such force. The elastic force may cause the tabs 207 and 206 to deflect and lay more flatly (than in absence of elastic force) on the outer surface of the heat spreader device 201 by forcing out and closing small gaps, wrinkles, and non-conformant curves between the two contacting surfaces.

The pliant gap-filler material 208 fills in remaining gaps and microscopic distances that may be created by differences in contours of surfaces that are in contact, namely, the tabs 206 and 207, and the outer surface of heat spreader device 201. The pliant gap-filler material may include heat conductive paste, heat conductive grease, a thin metal layer, gap pad, 3-D printed thermal conductive plastic, and the like. These gap-filler material are generally heat-conductive but electrical insulators. So they do not cause electrical shorts, while they can conduct heat away from the electronic components.

Figure 3A:
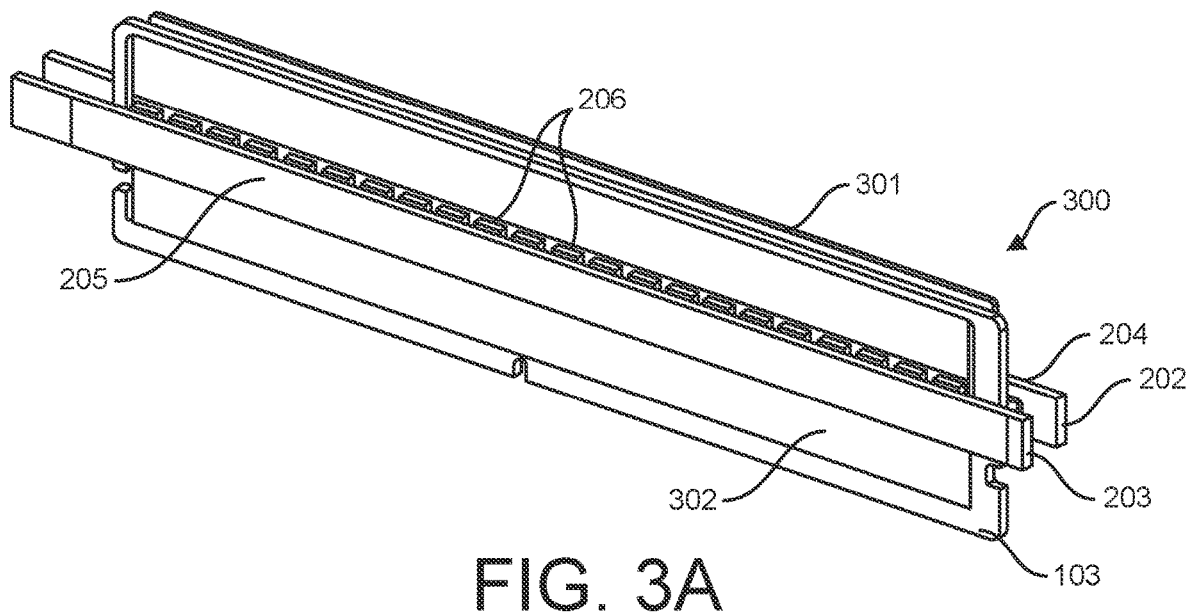
FIG. 3A is a DIMM assembly integrated with another type of cooling apparatus, according to one or more examples of the disclosure.

FIG. 3A depicts a DIMM assembly 300 integrated with another type of cooling apparatus, according to one or more examples of the disclosure. In an example implementation, the DIMM assembly 300 may include a DIMM 103, a heat spreader devices 301 and 302, heat transport devices 202 and 203 physically attached to heat transfer devices 204 and 205, the heat transfer devices 204 and 205 having elastic tabs or fingers 206. The basic structure and operation is similar to the configuration described with respect to FIG. 2A, as further described below for this implementation.

As described above with respect to FIG. 2A the DIMM 103 may have any form factor. For dense modern computers and servers, the DIMMs are packed more densely than before and run at higher clock speeds. As such, cooling may be targeted to the hot spots, namely the memory chips 104, to increase effective cooling for a given physical configuration. This may be accomplished by using the heat spreader devices 301 and 302 being coupled together with a cross member (see FIG. 33), covering both sides of the DIMM 103. The heat spreader devices 301 and 302 are joined by the cross member to form a single heat spreader device with two side-plates (i.e., 301 and 302). The pliant gap-filler material 208, such as thermal conductive grease, thermal conductive paste, a thin metal layer, a 3-D thermal conductive plastic fabric, gap pad, and the like may be used between the memory chips 104 and heat spreader device sides 301 and 302 to create a complete thermal path without bubbles, gaps, or non-contact areas, to transfer and distribute heat from the memory chips 104 to the heat spreader device.

The heat transfer devices 204 and 205 may be physically attached to the heat transport devices 202 and 203 for better thermal contact and heat transfer. The physical attachment between the heat transfer devices 204 and 205 and the heat transport devices 202 and 203 may be implemented by tightly wrapping the heat transfer devices 204 and 205 around the heat transport devices 202 and 203, respectively, spot-welding or soldering, using heat-conductive adhesives, or any other method of attachment suitable for effective conductive heat transfer. The heat transfer devices 204 and 205 may be made of thin and compliant material like a malleable sheet metal, such as steel or copper, heat conductive plastic sheet that is also elastic, heat conductive laminate materials that combine conductivity with elasticity, and the like. The heat transfer devices 204 and 205 may include elastic tabs or fingers 206 that conform to the two surfaces of the heat spreader devices 301 and 302 by elastic force to increase or effectively maximize thermal contact area for conductive heat transfer.

As indicated above and further described with respect to FIG. 3B below, in an example implementation, the heat spreader devices 301 and 302 are coupled with a cross member to create one double-sided heat spreader device with sufficient physical rigidity and integrity to maintain its shape. In another example implementation the heat spreader devices 301 and 302 may be coupled together by multiple cross members to hold the heat spreader devices 301 and 302 together while enclosing the DIMM 103. Generally, the heat spreader devices 301 and 302 are kept together with one or more cross members, similar to cross member 303 shown in FIG. 3B, to create sufficient force against the DIMM 103 to create an effective thermal contact.

The heat transport devices 202 and 203 remove the heat extracted by the heat spreader devices 301 and 302, and the heat transfer devices 204 and 205 from the heat sources memory chips 104 and remove the heat from the computing environment, such as the computer system enclosure or case and the computing space, such as a server room. The heat transport devices 202 and 203 may be any cooling device used to extract the heat generated by electronic components and move it away from the system containing those components. Examples of such devices include heat pipes, solid conductors, direct liquid cooling conduits, and the Ike. The structure of the DIMM assembly 300 is further described below with respect to FIG. 3B.

Figure 3B:
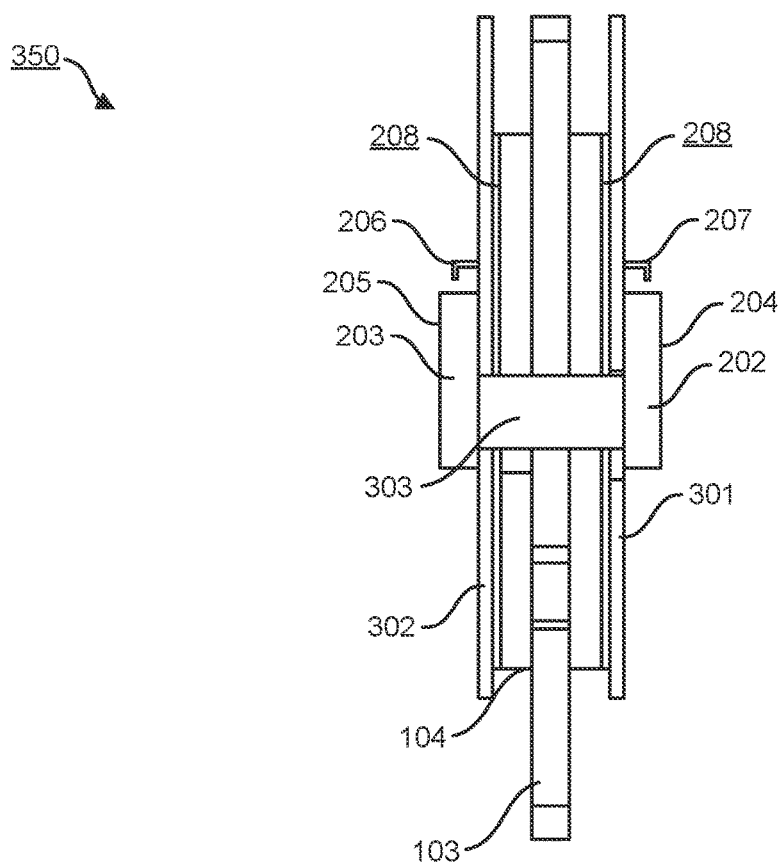
FIG. 3B is a cross sectional A-A view of the DIMM assembly of FIG. 3A, according to one or more examples of the disclosure.

FIG. 3B is a cross sectional view 350 of the DIMM assembly of FIG. 3A, according to one or more examples of the disclosure. The cross sectional view 350 includes DIMM 103, memory chips 104, a heat spreader devices 301 and 302 connected together by a structural cross member 303, heat transport devices 202 and 203, heat transfer devices 204 and 205 having tabs or fingers 207 and 206, respectively, and pliant gap-filler material 208.

The memory chips 104 on both sides of the DIMM 103 are thermally coupled to the interior surfaces of the heat spreader devices 301 and 302 (the surfaces facing the DIMM 103 as opposed to exterior surfaces facing away from DIMM 103) via the pliant gap-filler material 208 to create a high capacity and effective conductive path between the memory chips 104 and the inner surfaces of the heat spreader devices 301 and 302. The heat spreader devices 301 and 302 allows the heat extracted from the memory chips 104 to be spread over the wider surface areas of the heat spreader devices 301 and 302, reducing heat density.

As noted above, the heat spreader devices 301 and 302 are joined together by the cross member 303 and become a single heat spreader device with two side-plates. The heat spreader devices are coupled, on their exterior surfaces, with the elastic or spring-loaded tabs or fingers 207 and 206 of the heat transfer devices 204 and 205, respectively. As noted above with respect to FIG. 3A, the elastic tabs 207 and 206 exert a physical force on the exterior surfaces of the heat spreader devices 301 and 302 and conform to the shape of the exterior surfaces of the heat spreader devices 301 and 302, to form a higher capacity and more effective thermal conductive connection compared with not having an elastic member exert such force. The elastic force may cause the tabs 207 and 206 to deflect and lay more flatly (than in absence of elastic force) on the outer surface of the heat spreader devices 301 and 302 by forcing out and closing small gaps, wrinkles, and non-conformant curves between the two contacting surfaces.

The pliant gap-filler material 208 fills in remaining gaps and microscopic distances that may be created by differences in contours of surfaces that are in contact, namely, the heat transfer device tabs 206 and 207, and the outer surface of heat spreader devices 301 and 302. The pliant gap-filler material may include heat conductive paste, heat conductive grease, a thin metal layer, gap pad, 3-D printed thermal conductive plastic, and the like. These gap-filler materials are generally heat-conductive but electrical insulators. So, they do not cause electrical shorts, while they can conduct heat away from the electronic components.

Figure 4A:
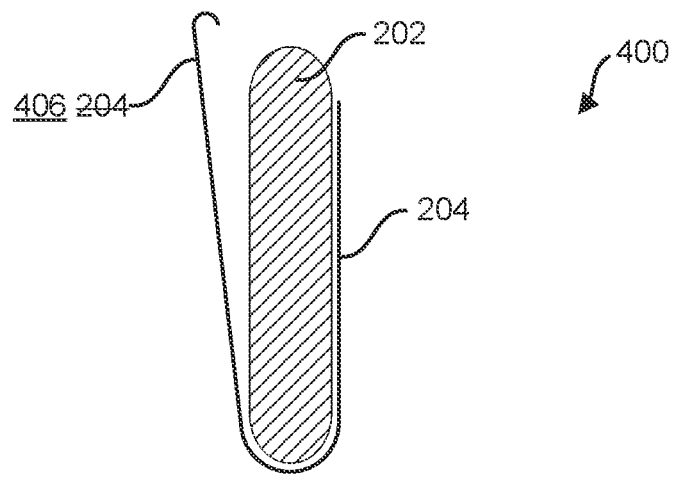
FIG. 4A is a cross section of a first type of a single-sided heat transfer device attached to a heat transport device, according to one or more examples of the disclosure.

FIG. 4A is a cross section 400 of a first type of a single-sided heat transfer device 204 attached to a heat transport device 202, according to one or more examples of the disclosure. The heat transport device 202 is attached to a first end of the heat transfer device 204 having a second elastic portion 406.

The heat transfer device 204 may be physically attached to the heat transport device 202 for better thermal contact and heat transfer. The physical attachment between the heat transfer device 204 and the heat transport device 202 may be implemented by tightly wrapping the heat transfer device 204 around the heat transport device 202 as shown in FIG. 4A, spot-welding or soldering, using heat-conductive adhesives, or any other method of attachment suitable for effective conductive heat transfer. The heat transfer device 204 may be made of thin and compliant material like a malleable sheet metal, such as steel or copper, heat conductive plastic sheet that is also elastic, heat conductive laminate materials that combine conductivity with elasticity, and the like. The force generated by the elastic portion 406 of the heat transfer device 204 may, when forced against the DIMM 103, causes conformation between the touching surfaces. This in turn, increases or effectively maximizes thermal contact area for conductive heat transfer.

The heat transfer device 204 may be wrapped around or attached to the heat transport device 202 in various configurations. In one example implementation shown in FIG. 4A, the first end of the heat transfer device 204 is attached to the heat transport device 202 on the surface opposite the surface near which the elastic portion 406 operates. The heat transfer device 204 is wrapped in a clockwise (or counter-clockwise, depending on reference frame) direction around the heat transport device 202, turn along a bottom (or top, depending on reference frame) of the heat transport device 202, and move away from the bottom (or top) to end up at the elastic portion 406.

The heat transfer device 204 is attached to a first side of the heat transport device 202 starting with the first end of the heat transfer device 204 and continuing until lit passes the bottom (or top) of the heat transport device 202. After this point, the heat transfer device 204 is unattached to the heat transport device 202 to allow room for the deflection of the elastic portion 406 when pressed against the heat spreader device.

The elastic portion 406 of the heat transfer device 204 may correspond, in whole or in part (e.g., the end tips), to and perform similar functions as the elastic tabs or fingers 206 and 207 discussed above with respect to FIGS. 2A-3B. As noted above with respect to the elastic tabs 206 and 207, the elastic portion 406 may be implemented as multiple tabs or as one continuous edge.

Figure 4B:
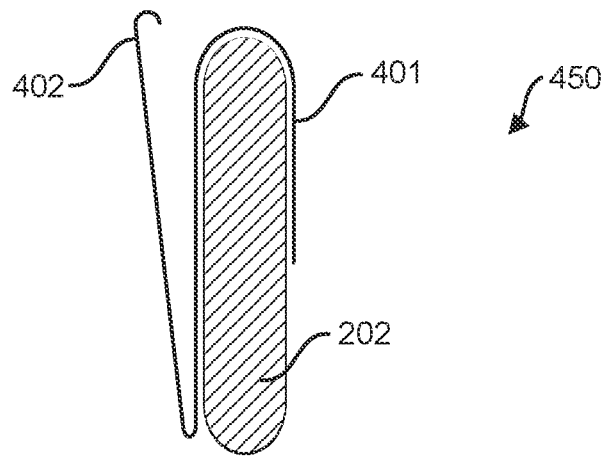
FIG. 4B is a cross section of a second type of a single-sided heat transfer device attached to a heat transport device, according to one or more examples of the disclosure.

FIG. 4B is a cross section 450 of a second type of a single-sided heat transfer device 401 attached to the heat transport device 202, according to one or more examples of the disclosure. The heat transport device 202 is attached to a first end of the heat transfer device 401 having a second elastic portion 402.

In the example implementation shown in FIG. 4B, the first end of the heat transfer device 401 is attached to the heat transport device 202 on the surface opposite the surface near which the elastic portion 402 operates. The heat transfer device 401 is wrapped in a counter-clockwise (or clockwise, depending on reference frame) direction around the heat transport device 202, turn along a top (or bottom, depending on reference frame) of the heat transport device 202, and move away from the top (or bottom) towards the bottom (or top). At this point, the heat transfer device 401 is bent back towards the top in a clockwise (or counter-clockwise) direction up to the elastic portion 402.

The heat transfer device 401 is attached to a first side of the heat transport device 202 starting with the first end of the heat transfer device 401 and continuing until it passes the top (or bottom) of the heat transport device 202. It continues along a second side of the heat transport device 202 to the bottom (or top). After this point, the heat transfer device 401 is unattached to the heat transport device 202 to allow room for the deflection of the elastic portion 406 when pressed against the heat spreader device.

Figure 4C:
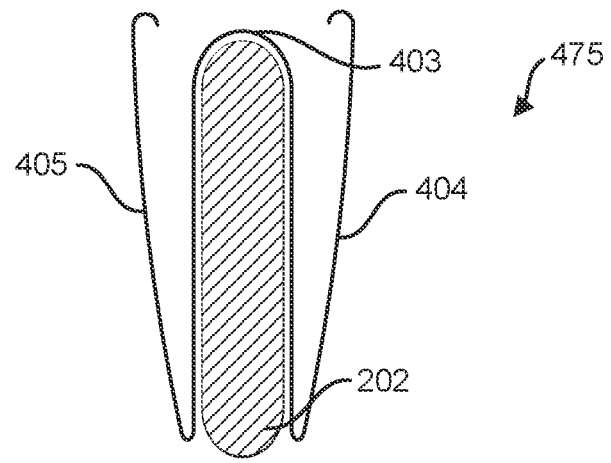
FIG. 4C is a cross section of a double-sided heat transfer device attached to a heat transport device, according to one or more examples of the disclosure.

FIG. 4C is a cross section 475 of a double-sided heat transfer device 403 attached to a heat transport device 202, according to one or more examples of the disclosure. The heat transport device 202 is attached to a middle section of the heat transfer device 403 having two elastic portions 404 and 405.

In the example shown in FIG. 4C, the middle section of the heat transfer device 403, between the two elastic portions 404 and 405, is wrapped around the heat transport device 202 on the top (or bottom, depending on reference frame) and both sides of the heat transport device 202 down to the bottom (or top) part of the heat transport device 202, as shown. At this point, each of the elastic portions 404 and 405 of the heat transfer device 401 is bent back towards the top to form the elastic tabs 206 and 207.

The heat transfer device 403 is attached to the top (or bottom) of the heat transport device 202 starting with the middle section of the heat transfer device 403 and continuing down both sides of the heat transport device 202 until it reaches the bottom (or top) of the heat transport device 202. Then both elastic portions 404 and 405 of the heat transfer device 403 are bent back towards the top (or bottom) to form (in whole or in part) the elastic tabs, as noted above. After this point of bending, the heat transfer device elastic portions 404 and 406 are unattached to the heat transport device 202 to allow room for the deflection of the elastic portion 404 and 405 when pressed against the heat spreader device. In this configuration, the heat transfer device 403 has two sets of elastic tabs configured to act in opposite directions. This way, the heat transfer device 403 can use one set of elastic tabs for one DIMM while simultaneously using the other set of elastic tabs for another adjacent DIMM.

This configuration provides a double-sided heat transfer device 403 that can connect with two adjacent DIMMs simultaneously, as further described below with respect to FIG. 6.

Figure 5:
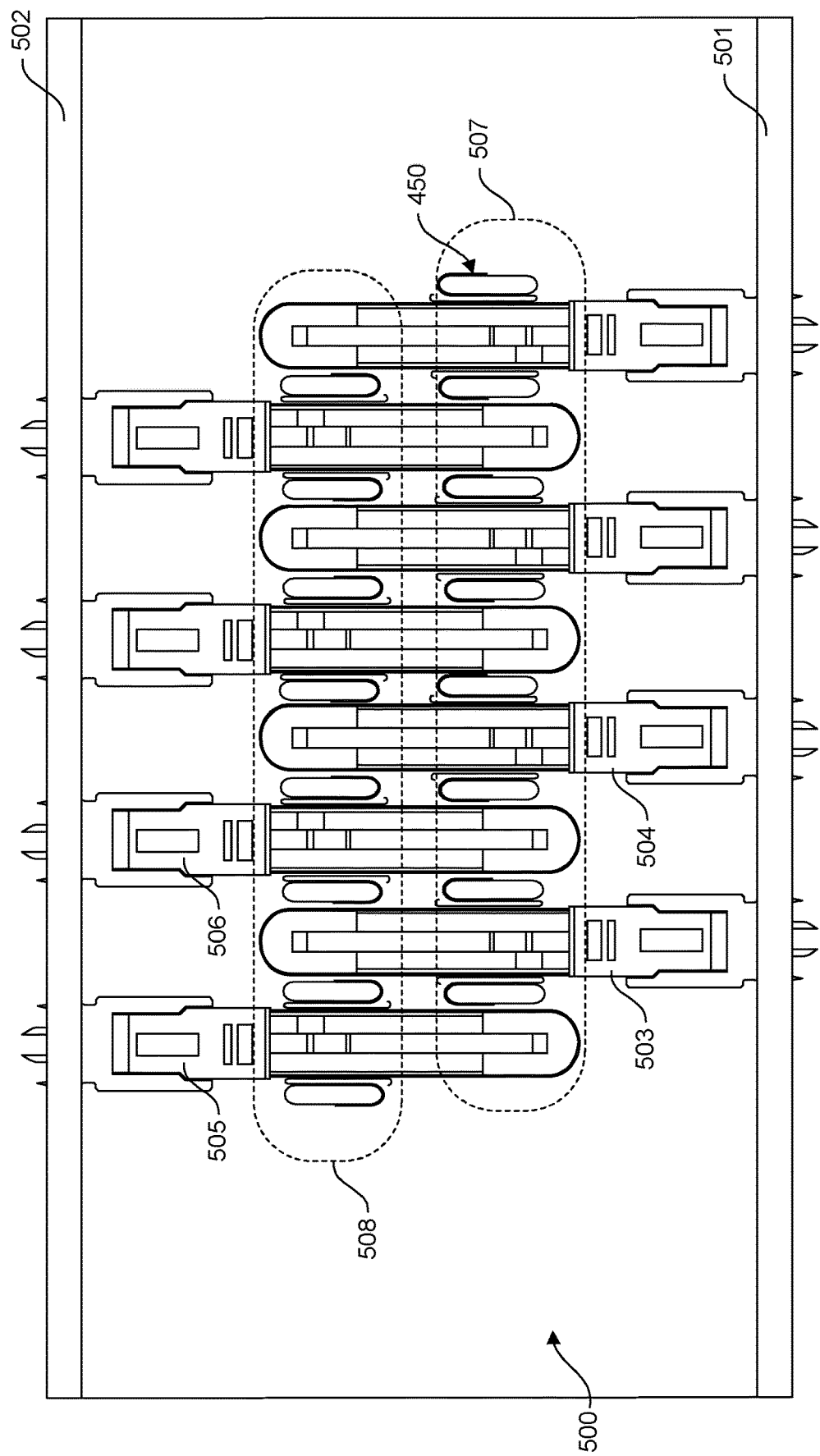
FIG. 5 is a cross section of multiple DIMM assemblies of FIG. 2B with one-sided heat transfer devices, according to one or more examples of the disclosure.

FIG. 5 is a cross section 500 of multiple DIMM assemblies of FIG. 28 with one-sided heat transfer devices shown in cross section 450, according to one or more examples of the disclosure. This arrangement includes two memory boards 501 and 502, multiple DIMMs 503 and 504 supported by memory board 501, multiple DIMMs 505 and 506 supported by memory board 502, with a set 507 of heat transfer devices for memory board 501, and set 508 of heat transfer devices for memory board 502.

In an example implementation, in a computer system, the two memory boards 501 and 502 may be placed across each other to increase the memory capacity of the computer system by increasing memory density (defined as amount of memory per unit of physical space). The memory density is increased by allowing DIMMs supported by each of the memory boards 501 and 502 to be interdigitated and leave little unused gap in the space enclosed between the two memory boards 501 and 502.

In this example configuration, the set 507 of heat transfer devices 450 serves the cooling needs of all DMMs 503 and 504 supported by memory board 501. Similarly, the set 508 of heat transfer devices 450 serves the cooling needs of all DMMs 505 and 506 supported by memory board 501. This way, each memory board 501 and 502 has cooling independent of the other memory board. Each of the DIMMs 503, 504, and each of the DIMMs 505, and 506, on each of the memory boards 501 and 502, respectively, has two cooling apparatuses, each cooling apparatus including a heat spreader device, a heat transfer device, and a heat transport device, separately and independently from any other DIMM on either memory board. This configuration increases memory density by interdigitating the DIMMs on both memory boards 501 and 502, Cooling density (defined as amount of heat removed per unit area per unit time—similar to heat density) remains the same as for an individual DIMM. In another configuration described below with respect to FIG. 6, both memory density and cooling density are increased.

Figure 6:
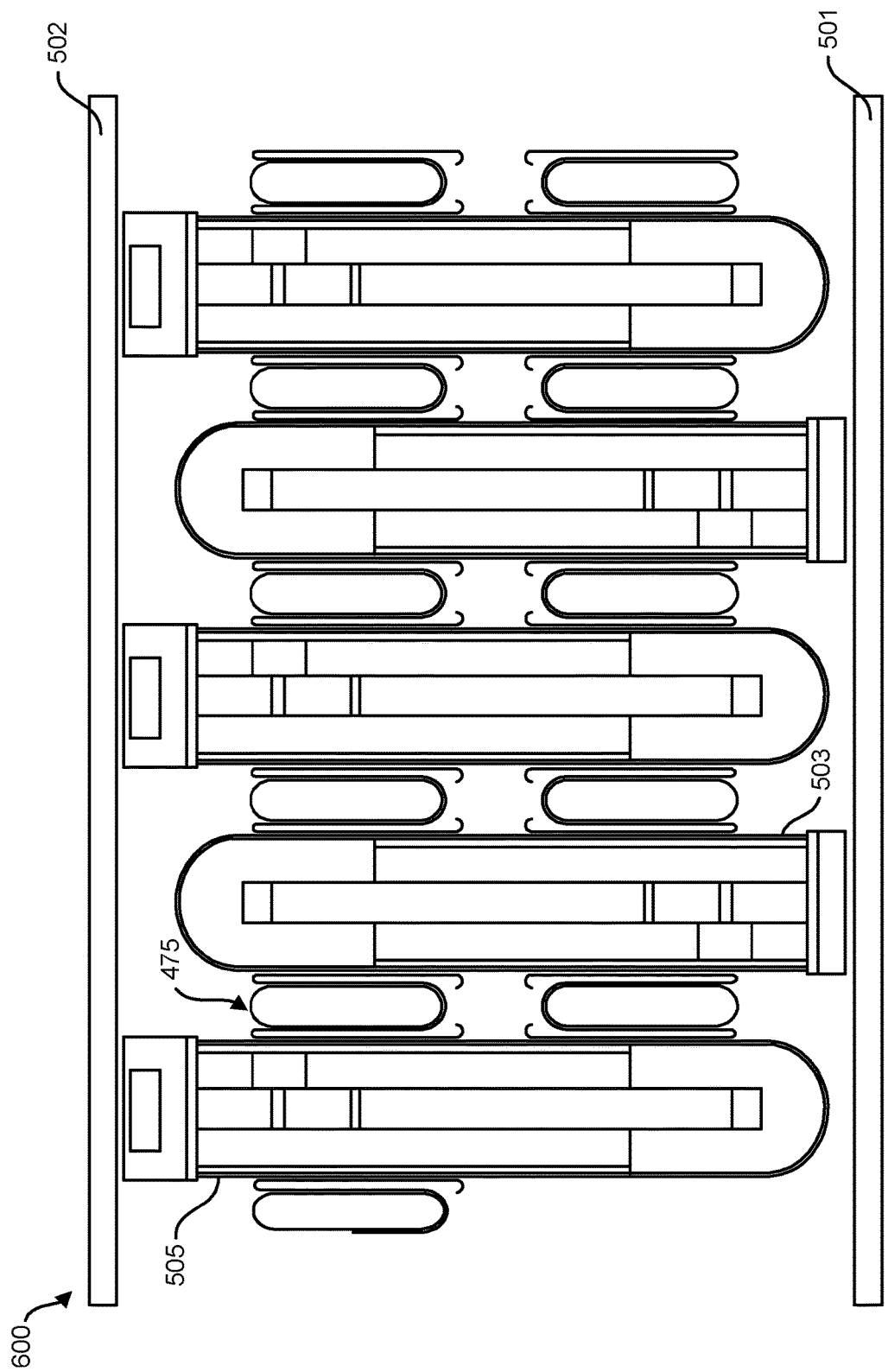
FIG. 6 is a cross section of multiple DIMM assemblies of FIG. 2B with two-sided heat transfer devices, according to one or more examples of the disclosure.

FIG. 6 is a cross section 600 of multiple DIMM assemblies of FIG. 28 with two-sided heat transfer devices shown in cross section 475, according to one or more examples of the disclosure. This arrangement includes two memory boards 501 and 502 supporting multiple DIMMs 503 and 505, respectively.

In a manner similar to that described above with respect to FIG. 5, in this example implementation, in a computer system, the two memory boards 501 and 502 may be placed across each other to increase the memory capacity of the computer system by increasing memory density. The memory density is increased by allowing DIMMs supported by each of the memory boards 501 and 502 to be interdigitated and leave little unused gap in the space enclosed between the two memory boards 501 and 502.

In this example configuration, the set of all double-sided heat transfer devices 475 serve the cooling needs of all DMMs 503 and 505 supported by both memory boards 501 and 502. This way, each of the memory boards 501 and 502 has cooling in common with the other memory board. And each pair of adjacent DIMMs 503 and 505, share a cooling apparatus including a heat spreader device, a double-sided heat transfer device, and a heat transport device. In an interdigitated configuration of DIMMs, each adjacent pair of DIMMs includes one DIMM from one memory board and the other DIMM from the other memory board. This configuration increases the cooling density to approximately double the cooling density of the configuration of FIG. 5, because each DIMM has four cooling apparatuses that remove heat from it.

This configuration increases memory density by interdigitating the DIMMs on both memory boards 501 and 502. Cooling density is also increased as noted above.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

This concludes the detailed description. The particular embodiments disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the appended claims. Accordingly, the protection sought herein is as set forth in the claims below.

What is claimed is:

1. A circuit board cooling apparatus, the cooling apparatus comprising:
   a heat spreader device to be thermally coupled with a surface of a circuit board to be cooled and having a surface contour;
   a heat transfer device thermally and physically coupled with the heat spreader device, having a first side and a second side, and conforming to the surface contour of the heat spreader device on the first side of the heat transfer device, wherein the heat transfer device has a plurality of elastic tabs to conform to the surface contour of the heat spreader device; and
   a heat transport device physically attached to and thermally coupled with the second side of the heat transfer device.

2. The circuit board cooling apparatus of claim 1, further comprising a gap-filler material to be deployed between the circuit board and the heat spreader device.

3. The circuit board cooling apparatus of claim 1, the heat spreader device having a U-shaped cross section to cover both sides of the circuit board.

4. The circuit board cooling apparatus of claim 1, the heat spreader device having two side-plates coupled with a cross member to create a single heat spreader device to cover both sides of the circuit board.

5. The circuit board cooling apparatus of claim 1, the conforming heat transfer device having a single elastic edge to conform to the surface contour of the heat spreader device.

6. The circuit board cooling apparatus of claim 1, the heat transfer device being made of one of a metal layer and heat-conducting plastic.

7. The circuit board cooling apparatus of claim 1, the heat transfer device being wrapped around and physically attached to the heat transport device.

8. The circuit board cooling apparatus of claim 1, wherein the heat transport device is a heat pipe.

9. A cooling assembly comprising:
   a first memory board including a first plurality of memory modules; and
   a second memory board including a second plurality of memory modules, facing the first memory board, the first plurality of memory modules and the second plurality of memory modules being interdigitated, and each memory module of the first plurality of memory modules and the second plurality of memory modules includes two cooling apparatuses, each cooling apparatus having:
      a respective heat spreader device to be thermally coupled with a surface of the respective memory module;
      a respective single-sided conforming heat transfer device thermally and physically coupled with the heat spreader device to conform to a surface contour of the heat spreader device on a first side of the heat transfer device; and
      a respective heat transport device physically attached and thermally coupled with a second side of the heat transfer device.

10. The cooling assembly of claim 9, the first and the second plurality of memory modules being dual inline memory modules (DIMM).

11. The cooling assembly of claim 9, the respective heat spreader device having a U-shaped cross section.

12. The cooling assembly of claim 9, the respective heat spreader device having two side-plates joint by a cross member.

13. The cooling assembly of claim 9, the respective single-sided conforming heat transfer device including a plurality of elastic tabs.

14. The cooling assembly of claim 9, one of a gap pad, a conductive paste, and a 3-D printed heat-conductive plastic to be deployed as a gap-filler material between the heat spreader device and the memory modules.

15. The cooling assembly of claim 9, the respective conforming heat transfer device being physically attached to the heat transport device by one of a spot-weld, a solder, and conductive adhesive.

16. A cooling assembly comprising:
a first memory board including a first plurality of memory modules; and
a second memory board including a second plurality of memory modules, facing the first memory board, the plurality of first memory modules and the second plurality of memory modules being interdigitated, and each pair of the first plurality of memory modules and second plurality of memory modules sharing two cooling apparatuses, each cooling apparatus having:
a respective heat spreader device to be thermally coupled with a surface of the memory module;
a respective double-sided conforming heat transfer device thermally and physically coupled with the heat spreader device to conform to a surface contour of the heat spreader device on a first side of the heat transfer device; and
a respective heat transport device physically attached and thermally coupled with a second side of the heat transfer device.

17. The cooling assembly of claim 16, each pair of the plurality of memory modules having one memory module from the first memory board and another one memory module from the second memory board.

18. The cooling assembly of claim 16, each memory module being cooled by four cooling apparatuses.

19. The cooling assembly of claim 16, the double-sided conforming heat transfer device having two sets of elastic tabs.

* * * * *